United States Patent
Kim et al.

(10) Patent No.: US 10,559,336 B2
(45) Date of Patent: Feb. 11, 2020

(54) STORAGE DEVICE INCLUDING MULTI DATA RATE MEMORY DEVICE AND MEMORY CONTROLLER

(71) Applicant: SAMSUNG ELECTRONICS CO., LTD., Suwon-si, Gyeonggi-Do (KR)

(72) Inventors: Hyeon-Wu Kim, Gyeongsangbuk-do (KR); Seok-Won Ahn, Suwon-si (KR); Chan-Ho Yoon, Seoul (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 16/140,066

(22) Filed: Sep. 24, 2018

(65) Prior Publication Data
US 2019/0139588 A1    May 9, 2019

(30) Foreign Application Priority Data

Nov. 8, 2017   (KR) .................. 10-2017-0148321

(51) Int. Cl.
| | | |
|---|---|---|
| G11C 7/00 | (2006.01) | |
| G11C 7/22 | (2006.01) | |
| G06F 12/02 | (2006.01) | |
| H03L 7/081 | (2006.01) | |
| G06F 5/08 | (2006.01) | |
| G06F 13/16 | (2006.01) | |
| G06F 1/08 | (2006.01) | |
| G06F 1/12 | (2006.01) | |

(52) U.S. Cl.
CPC ............... *G11C 7/222* (2013.01); *G06F 1/08* (2013.01); *G06F 5/08* (2013.01); *G06F 12/0246* (2013.01); *G06F 13/1689* (2013.01); *H03L 7/0812* (2013.01); *G06F 1/12* (2013.01); *G06F 2212/7208* (2013.01)

(58) Field of Classification Search
CPC ...................................................... G11C 29/023
USPC .......................................................... 365/193
See application file for complete search history.

(56) References Cited

U.S. PATENT DOCUMENTS

| | | | |
|---|---|---|---|
| 8,166,316 B2 | 4/2012 | Kapil | |
| 8,966,208 B2 * | 2/2015 | Gillingham | ........... G06F 1/3203 |
| | | | 711/167 |
| 8,977,806 B1 | 3/2015 | Rosenband et al. | |
| 9,063,849 B2 | 6/2015 | Lee et al. | |
| 9,317,429 B2 | 4/2016 | Ramanujan et al. | |

(Continued)

FOREIGN PATENT DOCUMENTS

JP        2007310549 A    11/2007

*Primary Examiner* — Min Huang
(74) *Attorney, Agent, or Firm* — Volentine, Whitt & Francos, PLLC

(57) ABSTRACT

A memory controller is used to control a first storage block having a first data rate and a second storage block having a second data rate. The memory controller includes; a memory interface that transceives a data signal and a data strobe signal with the first and second storage blocks, and a sub controller that stores access information about the first data rate and the second data rate. The sub controller may include a delay lookup table storing access information including first strobe adjustment timing information defining a first data strobe signal provided to the first storage block, and second strobe adjustment timing information defining a second data strobe signal provided to the second storage block.

19 Claims, 12 Drawing Sheets

(56) References Cited

U.S. PATENT DOCUMENTS

| | | | |
|---|---|---|---|
| 2009/0010083 A1* | 1/2009 | Vergnes | G06F 13/1689 365/194 |
| 2012/0155167 A1* | 6/2012 | Uehara | G11C 11/5628 365/185.03 |
| 2013/0100750 A1* | 4/2013 | Ishiguro | H03K 19/1776 365/189.011 |
| 2015/0348605 A1* | 12/2015 | Jang | G11C 7/22 365/230.02 |
| 2016/0087618 A1* | 3/2016 | Niitsuma | H03K 5/135 365/233.11 |
| 2016/0299525 A1* | 10/2016 | Cho | G06F 1/10 |
| 2016/0370998 A1 | 12/2016 | Shung et al. | |
| 2018/0032275 A1* | 2/2018 | Pahwa | G06F 3/0649 |

\* cited by examiner

STORAGE DEVICE INCLUDING MULTI DATA RATE MEMORY DEVICE AND MEMORY CONTROLLER

CROSS-REFERENCE TO RELATED APPLICATION

This application claims the benefit of Korean Patent Application No. 10-2017-0148321 filed on Nov. 8, 2017, the subject matter of which is hereby incorporated by reference.

BACKGROUND

The inventive concept relates to a storage device including a multi data rate memory device and a memory controller for same. More particularly, the inventive concept relates to a memory controller for a storage device including a sub controller that controls operations directed to storage blocks having different data rates.

In order to control memories or storage devices having different operating speeds a number of corresponding channels are usually required. The memory controller may include channel interfaces corresponding to the respective channels, where each channel interface may modulate a reference clock signal and transceive signals via connected channels in synchronization with the modulated reference clock signal.

A delay locked loop (DLL) circuit may be used to control a delay line, such that the phase of an input reference clock signal matches phase(s) of feedback signals output through the delay line. A master DLL circuit may detect a lock value corresponding to a lock state and provide the lock value to a slave DLL circuit.

SUMMARY

The inventive concept provides a memory controller capable of controlling a plurality of memories or storage devices having reduced chip sizes and different operating speeds, and a storage device including the memory controller.

In one embodiments the inventive concept provides a memory controller configured to control a first storage block operating at a first data rate and a second storage block operating at a second data rate different from the first data rate. The memory controller includes; a memory interface configured to transceive data signal and a data strobe signal with the first storage block and the second storage block, and a sub controller including a delay lookup table storing access information including first strobe adjustment timing information defining a first data strobe signal provided to the first storage block, and second strobe adjustment timing information defining a second data strobe signal provided to the second storage block.

In another embodiment, the inventive concept provides a storage device including; a first storage block having a first operating speed, a second storage block having second operating speed different from the first operating speed, a memory controller configured to control operation of the first storage block and the second storage block, and a channel configured to connect the memory controller with the first storage block, and the second storage block. The memory controller includes; a memory interface configured to transceive a data signal and a data strobe signal with the first storage block and the second storage block via the channel, and a sub controller configured to store access information about the first operating speed and the second operating speed, wherein the access information is sequentially provided to the memory interface by the sub controller.

In another embodiment, the inventive concept provides a storage block including; a first storage block having a first operating speed and a second storage block having a second operating speed different from the first operating speed, a memory controller configured to control an operation of the first storage block and the second storage block, and a channel configured to connect the memory controller with the first storage block and the second storage block. The memory controller includes; a sub controller configured to store access information associated with the first storage block and the second storage block based on respective operating priorities for the first storage block and the second storage block, and a multi clock generator configured to generate a plurality of clock signals having different frequencies.

BRIEF DESCRIPTION OF THE DRAWINGS

Embodiments of the inventive concept will be more clearly understood from the following detailed description taken in conjunction with the accompanying drawings in which.

DETAILED DESCRIPTION

Hereinafter, embodiments of the inventive concept will be described in some additional detail with reference to the accompanying drawings.

Figure (FIG.) 1 is a block diagram illustrating an electronic system 1 generally including a storage device 10 and a host 20. The storage device 10 may be a solid state drive (SSD). However, the inventive concept is not limited thereto, and the storage device 10 may be implemented in a variety of forms, such as an embedded multimedia card (eMMC), a universal flash storage (UFS), a compact flash (CF) card, a secure digital (SD) card, a micro-SD card, a mini SD card, an extreme digital (xD) card, and a memory stick.

The storage device 10 and host 20 may communicate via one or more interfaces. For example, using a competent interface the host 20 may transmit a command CMD and corresponding data to the storage device 10. In this regard the command CMD may be understood as defining a request that the storage device perform a particular data processing operation (e.g., a read operation, a write operation, an erase operation, a some type of housekeeping operation, etc.).

The host 20 may variously implemented using software and/or hardware resources. For example the host 20 may be a central processing unit (CPU), a generic processor, a microprocessor, an application processor (AP), or the like. In certain embodiments of the inventive concept, the host 20 may be implemented as a System-on-Chip (SoC).

Examples of interfaces that may be used to facilitate communication between the storage device 10 and host 20 include interfaces operating according to one or more conventionally understood technical specifications, such as the advanced technology attachment (ATA), serial ATA (SATA), external SATA (e-SATA), small computer small interface (SCSI), serial attached SCSI (SAS), peripheral component interconnection (PCI), PCI express (PCI-E), IEEE 1394, universal serial bus (USB), an SD card interface, a multimedia card (MMC) interface, an embedded multimedia card (eMMC) interface, and CF card interface.

Figure 1:
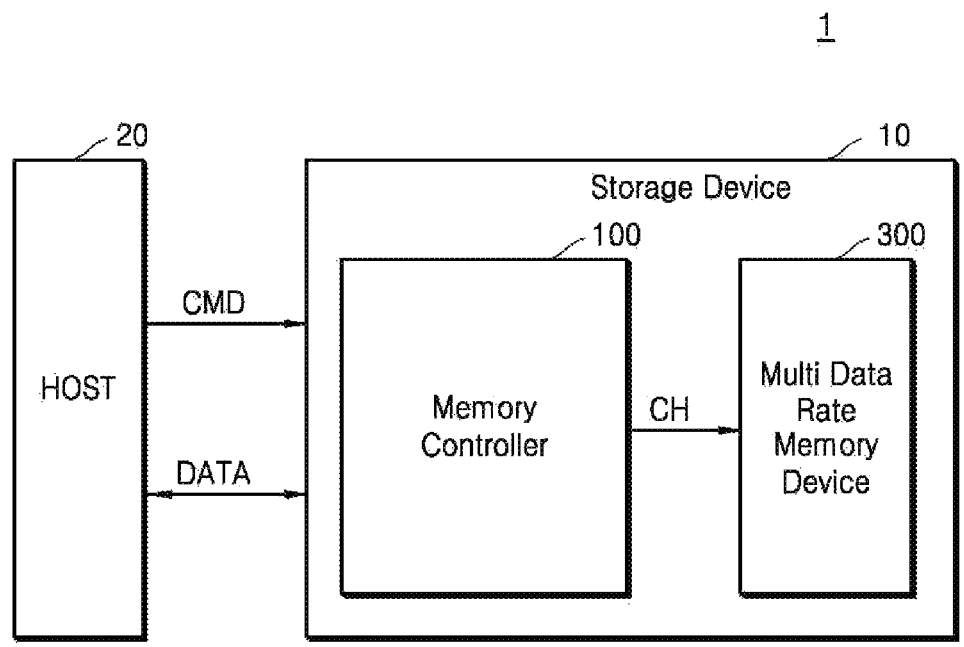
FIG. 1 is a block diagram illustrating an electronic system according to an embodiment of the inventive concept.

In the illustrated example of FIG. 1, the storage device 10 includes a multi data rate memory device 300 including storage blocks respectively capable of operating at different data rates. Here, each "storage block" may be physically implemented using one or more chips, but nonetheless may be variously accessed by the memory controller 100 and/or host 20 as a defined storage block having a defined data rate (i.e., a rate at which data may be accessed during one or more operations). In this regard, the data rate of a particular storage device may vary according to operating mode, power conditions, user settings, etc., but for any given moment in time the operation of the storage device may be defined a current data rate.

The multi data rate memory device 300 of FIG. 1 may be variously implemented, for example, in flash memory or a resistive memory such as resistive read-only memory (RAM) (ReRAM), phase change RAM (PRAM), and magnetic RAM (MRAM). In certain embodiments of the inventive concept, the multi data rate memory device 300 may implemented using an integrated circuit (IC) including a processor and RAM, such as a storage device and a processing in memory (PIM).

In this regard, the flash memory included in the multi data rate memory device 300 may be implemented in configurations including one or more three-dimensional (3D) memory array(s). A 3D memory array may be monolithically formed on at least one physical level of memory arrays which include an active region on a silicon substrate and a circuit related with operation of the memory cells on or in the silicon substrate. Here, the term "monolithic" denotes that layers for each level constituting the memory cell array are directly stacked above the layers of each lower level of the memory cell array. In one embodiment of the inventive concept, the 3D memory array may include vertical NAND strings arranged in a vertical direction, such that at least one memory cell is arranged above another memory cell, where the at least one memory cell includes a charge trapping layer.

The provision, configuration and operation of memory devices including 3D memory array(s) may be further understood by a review of U.S. Pat. Nos. 7,679,133; 8,553,466; 8,654,587; and 8,559,235, as well as published U.S. Patent Application 2011/0233648, the collective subject matter of which is hereby incorporated by reference.

Returning to FIG. 1, the storage device 10 include a memory controller 100 that may be variously configured and operated to control the performance of various data processing operations by the multi data rate memory device 300. And although not shown in FIG. 1, the storage device 10 may include a buffer memory (e.g., a volatile memory such as dynamic RAM (DRAM) or static RAM (SRAM)) to temporarily store data during the performance of read/write operations.

The memory controller 100 of FIG. 1 is shown controlling the operation of the multi data rate memory device 300 using a single channel CH connecting memory controller 100 with the multi data rate memory device 300. This is, of course, a simplified example used for clarity of description and a multiplicity of channels may be used to interoperate the memory controlled 100 and multi data rate memory device 300. However, in the context of the example illustrate din FIG. 1, the memory controller 100 may sequentially control storage blocks included in the multi data rate memory device 300 via channel CH.

In certain embodiments of the inventive concept, one or more memories (e.g., a buffer memory or register) or other component associated with (e.g., internally provided, or externally access by) the memory controller 100 may be used to store "access information" using (e.g.,) lookup table(s) and/or scheduler(s), where the access information is respectively associated with storage blocks. In this context, the lookup table(s) and/or scheduler(s) may be variously configured to store the access information. Further, the access information may be variously defined (e.g., stored, formatted, error corrected, etc.) for storage and access (e.g., reference) by the memory controller 100. However provided or defined, the memory controller 100 may use the access information to respectively (e.g., sequentially) control the storage blocks included in the multi data rate memory device 300. Examples of the memory controller 100 will be described hereafter in some additional detail with reference to FIGS. 2 and 3.

Figure 2:
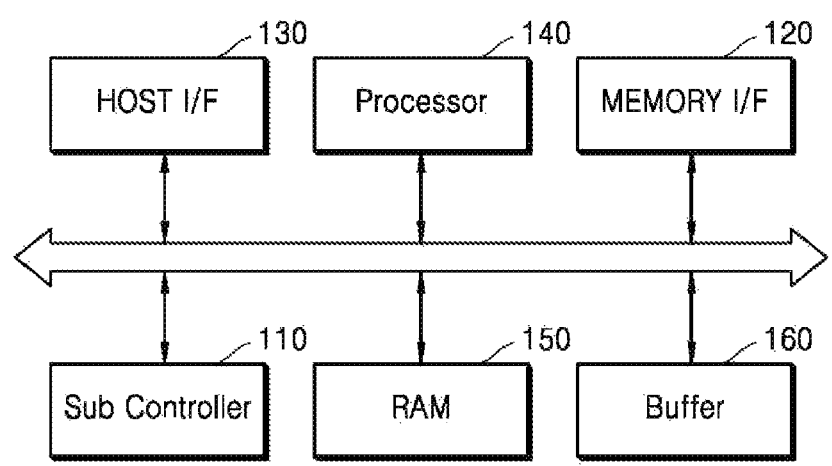
FIG. 2 is a block diagram further illustrating in one example the memory controller of FIG. 1 according to an embodiment of the inventive concept.

FIG. 2 is a block diagram further illustrating in one implementation the memory controller 100 of FIG. 1. The memory controller 100 may be a component provided in a storage device, such as an SSD or a memory card.

Referring to FIG. 2, the memory controller 100 include a sub controller 110, a memory interface (I/F) 120, a host interface (I/F) 130, a processor 140, RAM 150, and a buffer 160. Although only one processor 140 is shown in FIG. 2, the memory controller 100 may include more than one processor.

In certain embodiments of the inventive concept, the sub controller 110 may be used to store access information associated with a multi data rate memory device, such as the multi data rate memory device 300 of FIG. 1.

In certain embodiments of the inventive concept, the sub controller 110 may store access information characterizing an operating speed of each of the storage blocks included in the multi data rate memory device 300. Additionally or alternatively, the access information may include information used to adjust the timing of one or more strobe signal(s), such as a strobe signal used to properly synchronize a transceived data signal with the internal operation (e.g., read/write operation) of a particular storage block. Here, the term "transceived" is used to denote the transmitting and/or receiving of a signal between two components). Additionally or alternatively, the access information may include scheduling or scheduling control information (e.g., schedule information derived from a functioning scheduler). Scheduling information may be used, for example, to control the order (and/or timing) in which the memory controller 100 transceives a data signal (or more simply "data") to and/or from (hereafter, "to/from") each one of the storage blocks.

Referring to FIGS. 1 and 2, the memory controller 100 may communicate various signals with the host 20 via the host I/F 130, and with the multi data rate memory device 300 via the memory interface 120.

In certain embodiments of the inventive concept, the memory interface 120 may be implemented as part of a memory physical layer, and as such, the memory interface 120 may include a master delay locked loop (DLL) circuit and a slave DLL circuit. The operation of the master DLL circuit and slave DLL circuit will be described hereafter in some additional details with reference to FIG. 3.

Write data transceived from the host (HOST) 20 may be temporarily stored in the buffer 160 and then provided to the multi data rate memory device 300. Read data transceived from the multi data rate memory device 300 may be temporarily stored in the buffer 160 and then provided to the host 20. Thus, the buffer 160 may regarded as a data cache and may be variously implemented using ROM, PROM, EPROM, EEPROM, PRAM, flash memory, SRAM, and/or DRAM.

The RAM 150 may be used as a working memory and may be variously implemented, for example, with DRAM, SRAM, PRAM, and/or flash memory.

Figure 3:
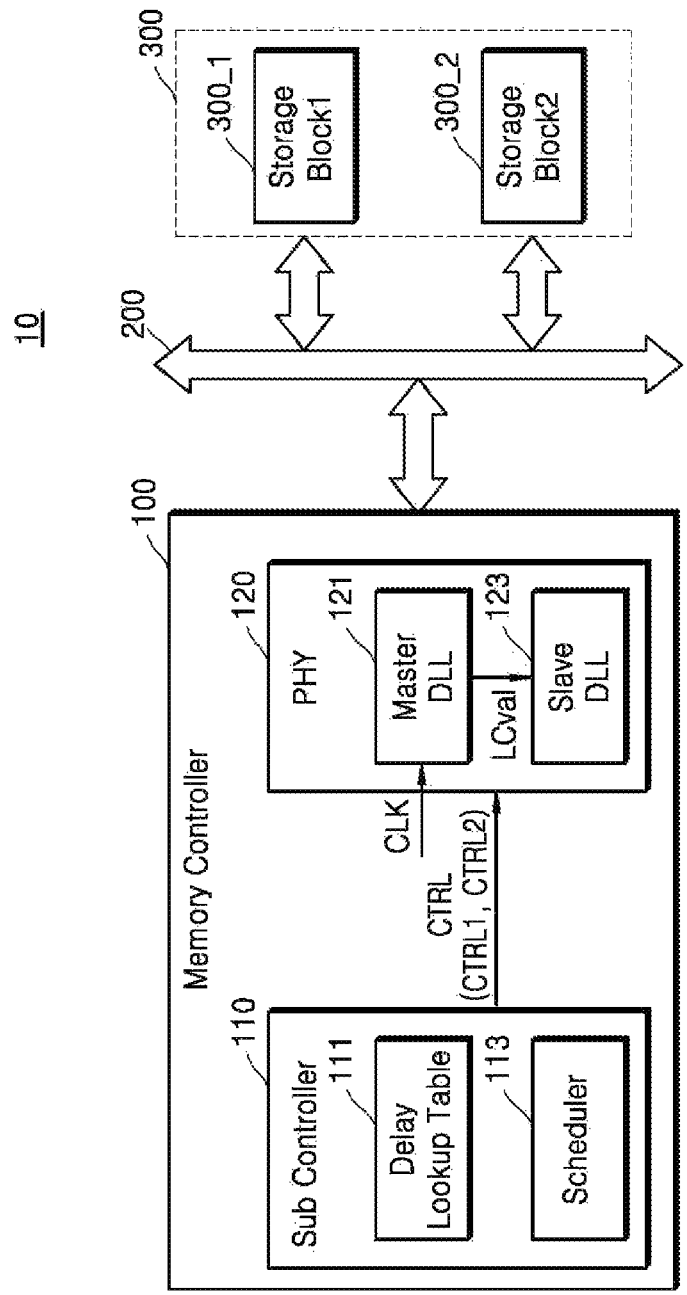
FIG. 3 is a block diagram further illustrating the storage device of FIG. 1 according to an embodiment of the inventive concept.

FIG. 3 is a block diagram further illustrating the storage device 10 of FIG. 1 in some additional detail.

Referring to FIG. 3, the storage device 10 includes the memory controller 100, a channel 200, and the multi data rate memory device 300. The memory controller 100 includes the sub controller 110 and the memory I/F 120 which provides a memory physical layer (PHY).

In FIG. 3, the multi data rate memory device 300 includes a first storage block (storage block1) 300_1 and a second storage block (storage block2) 300_2, where the first storage block 300_1 and the second storage block 300_2 operate at different data rates (i.e., different data access speeds for one or more operations). Although only two storage blocks are shown in FIG. 3, those skilled in the art will recognize that the inventive concept is not limited thereto, and three or more storage blocks may be connected to the memory controller 100 via one or more channel(s) 200. In addition, the storage device 10 may further include a plurality of storage blocks having different access information and operating at different data rates. For example, the first storage block 300_1 may include a plurality of flash memories, and the memory controller 100 may be connected to the plurality of flash memories via the channel 200.

As previously noted, the sub controller 110 may serve as a source of access information characterizing the storage blocks. Thus, in certain embodiments of the inventive concept, the sub controller 110 will store, retain, track, manage and/or update access information using various data structures and access techniques, such as those conventionally associated with lookup tables and schedulers. For example, the sub controller 110 may provide a delay lookup table 111 and a scheduler 113. The delay lookup table 111 may be used to store access information (e.g., strobe adjustment timing information, or access information used to adjust the timing of a data strobe signal) provided to and used by the first and second storage blocks 300_1 and 300_2. The strobe adjustment timing information may describe start time, end time, or a period adjustment for a data strobe signal used to synchronize a data signal. In this regard, the delay lookup table 111 may store first strobe adjustment timing information corresponding to the first storage block 300_1 and second strobe adjustment timing information for the second storage block 300_2.

Recognizing that the first and second storage blocks 300_1 and 300_2 included in the multi data rate memory device 300 operate at different data rates, and further recognizing that data will typically be written to or read from a memory component on the rising and/or falling edge of a data strobe signal, it is necessary to control the timing of a first data strobe signal (or a first application of a data strobe signal) for the first storage block 300_1 and a second data strobe signal (or a second application of the data strobe signal) for the second storage block 300_2. Each storage block therefore requires its own "strobe adjustment timing information" to properly define this particular control signal. One more detailed approach to the use of the delay lookup table 111 shown in FIG. 3 will be provided hereafter with reference to FIG. 4.

The scheduler 113 may be used to store additional access information characterizing the data rate (or operating speed) of the first and second storage blocks 300_1 and 300_2 included in the multi data rate memory device 300. In one embodiment, the scheduler 113 may be implemented with a first-in-first-out (FIFO), and in another embodiment, the scheduler 113 may be implemented with a linked list.

When the scheduler 113 is the FIFO, the scheduler 113 may sequentially store access information about the data rate (operating speed) of the first and second storage blocks 300_1 and 300_2 included in the multi data rate memory device 300. For example, access information about the data rate the first storage block 300_1 may be stored in the scheduler 113. such that the first storage block 300_1 transceives data with the memory controller 100 "ahead of" (temporally before) the second storage block 300_2. Accordingly, the sub controller 110 may sequentially provide a control signal CTRL to the memory physical layer 120 in accordance with access information about data rate stored in the scheduler 113.

When the scheduler 113 is a linked list, access information about the data rate of the first storage block 300_1 and the second storage block 300_2 may be stored based on a priority of the operation for the first storage block 300_1 and a priority of the operation for the second storage block 300_2. For example, unlike the FIFO approach described above, regardless of the order in which access information about the respective data rates of the first storage block 300_1 and second storage block 300_2 are stored, the access information about the data rate of the second storage block 300_2 may be output before or after the access information about the data rate the first storage block 300_1 is output, based on the priority.

Hence, a control signal CTRL may be defined by access information related to respective strobe adjustment timing information stored in the delay lookup table 111, and by independent access information about data rate controlling the memory physical layer 120. In combination or separately, information about a first data rate for the first storage block 300_1 and a second data for the second storage block 300_2 may be sequentially output from the scheduler 113, and a first strobe adjustment timing for the first storage block 300_1 and a second strobe adjustment timing for the second storage block 300_2 may be sequentially output from the delay lookup table 111. In this manner, a first control signal CTRL1 corresponding to the first storage block 300_1 and a second control signal CTRL2 corresponding to the second storage block 300_2 may be sequentially provided from the sub controller 110 to the physical layer 120. A detailed description of an embodiment assuming the use of a FIFO scheduler 113 will be provided hereafter with reference to FIG. 6.

The memory physical layer 120 illustrated in FIG. 3 includes a master DLL circuit 121 and a slave DLL circuit 123. The master DLL circuit 121 receives a reference clock signal CLK from a clock signal generator (not shown) in the memory controller 100 and provides a number of delay cells corresponding to the reference clock signal CLK as a lock value LCval.

In one embodiment, the reference clock signal CLK may be an operating clock signal of the memory controller 100 or an operating clock signal of the first storage block 300_1. In this case, the operating clock signal of the first storage block 300_1 may be faster than the operating clock signal of the second storage block 300_2. In other words, the operating speed (or data rate) of the first storage block 300_1 may be faster than the operating speed (or data rate) of the second storage block 300_2.

In this regard, the master DLL circuit 121 and the slave DLL circuit 123 may be variously implemented. For example, the master DLL circuit 121 and/or the slave DLL circuit 123 may include a number of delay cells, each delay cell being implemented as a pair of inverters connected in parallel to modulate a frequency, and the number of delay cells being connected in series.

In the illustrated example of FIG. 3, the slave DLL circuit 123 receives the lock value LCval from the master DLL circuit 121, and may then sequentially provide (i.e., output) to the channel 200 a data strobe signal DQS having an operating frequency corresponding to the defined data rate of the first storage block 300_1 and/or the second storage block 300_2. This may be accomplished using a selected number of delay cells corresponding to the operating frequency of the reference clock signal CLK. For example, when the lock value LCval corresponding to 200 MHz is about 50 (i.e., when a number of delay cells used to generate a 200 MHz reference clock signal CLK is 50), the slave DLL circuit 123 may output the data strobe signal DQS having an operating frequency of 100 MHz using 100 delay cells.

Having thus defined an appropriate operating frequency for the data strobe signal DQS, the slave DLL circuit 123 may make adjustment to this reference signal in accordance with strobe adjustment timing information respectively corresponding to the first storage block 300_1 and the second storage block 300_2, as provided (e.g.,) by the control signal CTRL received from the sub controller 110.

Conventionally, in order to transceive data with storage blocks such as a memory or a storage device having different operating speeds, channels corresponding to respective storage blocks would be provided, and a plurality of slave DLL circuits or a plurality of master DLL circuits would be connected to each storage block.

In contrast, the memory controller 100 and storage device 10 including the memory controller 100 according to embodiments of the inventive concept may include the sub controller 110 described above, such that data may be sequentially transceived with the first and second storage blocks 300_1 and 300_2, despite the fact that the different storage blocks operate ad different data rates. Using a single memory physical layer 120, a single master DLL circuit 121, and a single slave DLL circuit 123 to accomplish this outcome allows for notable reductions in overall chip size for the memory controller 100. In addition, when a new storage block is to be connected to the memory controller 100, since in many contemporary architectures it is possible to selectively storage blocks to a channel 200, only information associated with the new storage block need be stored (or updated to) the delay lookup table 111 and/or the scheduler 113. It is not necessary to manufacture a new memory controller.

Figure 4:
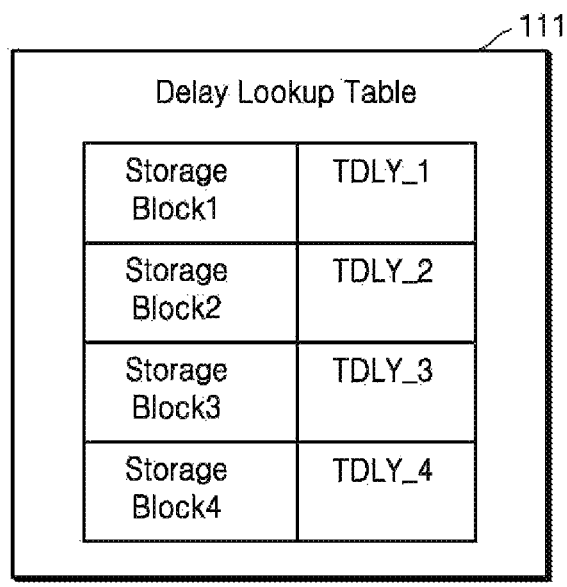
FIG. 4 is a conceptual diagram illustrating a delay lookup table that may be included in the memory controller of FIG. 3.

FIG. 4 is a conceptual diagram illustrating one possible version of the delay lookup table 111 included in the memory controller 100.

Referring to FIGS. 3 and 4, the delay lookup table 111 may be used to store various strobe adjustment timing information for a data strobe signal used to control transceiving of data in relation to a plurality of storage blocks included in the multi data rate memory device 300 connected to the channel 200. For example, in one implementation, respective strobe adjustment timing information may take the form of a delay time. Each delay time may denote a time delay (+/−) from a start time for the data strobe signal. Here, delay times may be expressed as portions of a reference clock period, and may be defined in relation to a falling signal edge and/or a rising signal edge. Thus, the delay time may be a time duration, from an arbitrarily selected start time at which the edge of the data strobe signal is expected (e.g., one-quarter of the clock period for the reference clock signal). For example, the delay time may a delay from a time point at which the data signal starts, after a one-quarter value of a clock period of the reference clock signal has passed, to a time point at which an edge of the data strobe signal starts.

In the illustrated example of FIG. 4, the multi data rate memory device is assumed to include first, second, third and fourth storage blocks (storage block1, storage block3, storage block3 and storage block4). Respective first, second, third and fourth data strobe signals are used to control the transceiving of data. Thus, with reference to a control signal (e.g., data strobe signal DQS) data is transceived with the first storage block1 using a first data strobe signal characterized by a first delay time TDLY1; data is transceived with the second storage block2 using a second data strobe signal characterized by a second delay time TDLY2; data is transceived with the third storage block3 using a third data strobe signal characterized by a third delay time TDLY3; and data is transceived with the fourth storage block4 using a fourth data strobe signal characterized by a fourth delay time TDLY4. Only four delay times are illustrated in FIG. 4, but the inventive concept is not limited thereto. The number of delay times stored in the delay lookup table 111 will vary with the number of storage blocks included in the multi data rate memory device.

Of further note, even when the first, second, third and fourth storage blocks are homogeneously implemented using the same type of memory device (e.g., flash memory), the respective storage blocks may nonetheless exhibit different operating speeds (data rates) when connected to and/or operated by the memory controller 100. Hence, each storage block of a multi data rate memory device will require respective storage adjustment timing information stored in the delay lookup table 111.

Not surprisingly, embodiments of the inventive concept are particularly well suited to heterogeneously implemented storage devices. That is, respective operating speeds for flash memory, various resistive memories and PIM including a field programmable date array (FPGA) will vary considerably, and corresponding strobe adjustment timing information will vary accordingly. However, this is only illustrative, and the operating speeds of the storage blocks included in a multi data rate memory device are not limited to these expressly identified memory types.

With regard to the embodiment illustrated in FIG. 4, two or more delay times may be stored for one storage block (e.g., mode-specific delay times) and delay times for storage blocks or other memories not connected to channel 200 may also be stored in the delay lookup table 111.

Figure 5A:
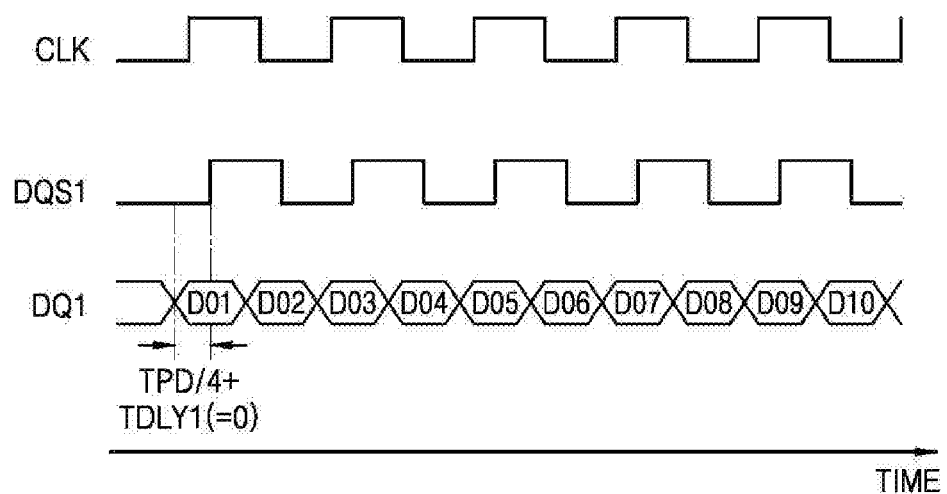
FIGS. 5A and 5B are respective timing diagrams illustrating an approach of delaying various signals provided to the multi data rate memory device of FIGS. 1 and 3.
Figure 5B:
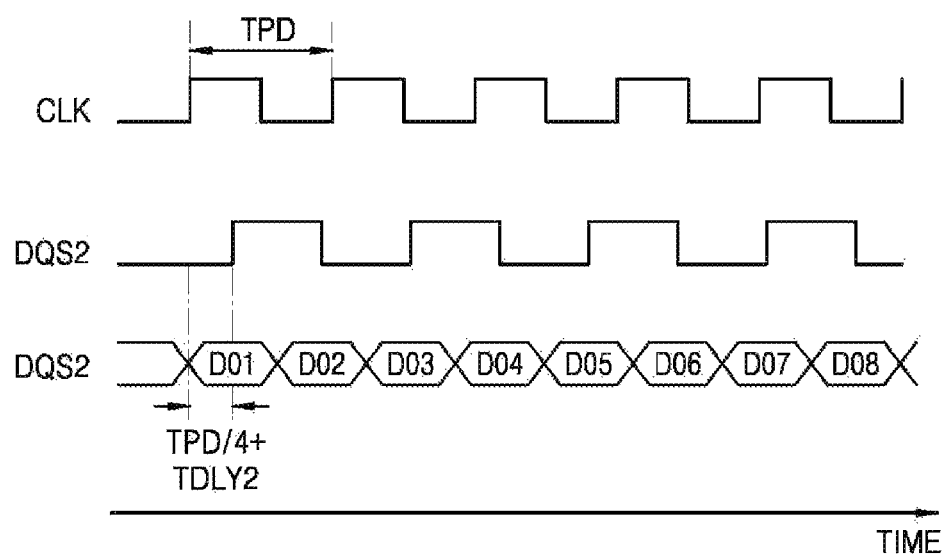

FIGS. 5A and 5B are respective timing diagrams explaining a delay time according to an embodiment of the inventive concept. The timing diagram of FIG. 5A shows a delay time for the first storage block storage block1, and the timing diagram of FIG. 5B shows a delay time for the second storage block storage block2.

Referring to FIGS. 3, 4 and 5A, the clock signal generator internal to the memory controller 100 generate a reference clock signal CLK corresponding to a fastest operating speed (data rate) for a particular storage block among a plurality of storage blocks connected via channel 200.

Assuming that the first storage block—among the first, second, third and fourth storage blocks—has a first data rate (corresponding to a fastest operating speed), the clock signal generator may generate the reference clock signal CLK having a first clock frequency corresponding to the first data rate. Hence, a first data strobe signal DQS1 associated with the first storage block may have a frequency equal to (or otherwise defined by) the first clock frequency of the reference clock signal CLK. Under these assumptions, the first delay time TDLY1 stored in the delay lookup table 111 may have a value of '0', and the slave DLL 123 may output the first data strobe signal DQS1 having a delay of one-quarter of the clock period TPD of the reference clock signal CLK based on the time point at which the data signal DQ1 is generated.

Referring again to FIGS. 3, 4 and 5B, the second storage block has a slower operating speed (data rate) than the first storage block. Thus, the frequency of a second data strobe signal DQS2 for the second storage block will lower than the frequency of the reference clock signal CLK, as defined above. Accordingly, the second delay time TDLY2 will have a positive value, and the slave DLL circuit 123 will output the second data strobe signal DQS2 by adding the second delay TDLY2 to the quarter value of the clock period TPD of the reference clock signal CLK, based on the time point at which the data signal DQ2 is generated.

In this manner as one example, a memory controller and a storage device including a multi data rate memory device including a memory controller according to an embodiment of the inventive concept may efficiently generate a plurality of data strobe signals using a plurality of delay times, respectively associated with each one of a plurality of storage blocks. And since the different data strobe signals are generated using the different delay times stored prior to data processing operations, the overall burden placed on the memory physical layer may be reduced. Further, it is not necessary to separately provide a master DLL circuit or a slave DLL circuit corresponding to each of the plurality of the storage blocks.

Figure 6:
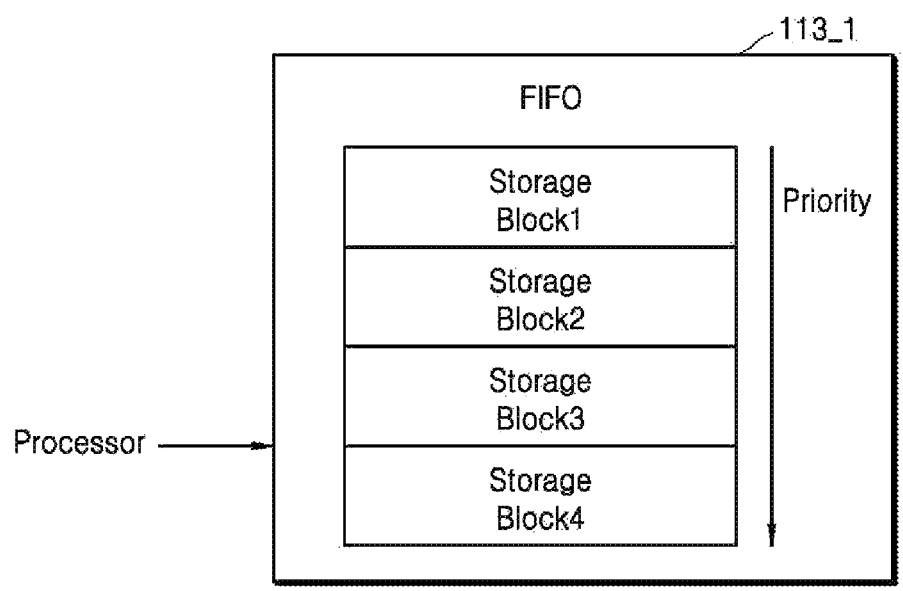
FIG. 6 is a conceptual diagram illustrating the use of a first in first out (FIFO) with the memory controller of FIGS. 1 and 3.

FIG. 6 is a conceptual diagram illustrating a FIFO 113_1 included in the memory controller 100 according to certain embodiments of the inventive concept.

Referring to FIGS. 3 and 6, the scheduler 113 if FIG. 3 may be implemented as the FIFO 113_1 shown in FIG. 6. Here, access information about the operating speed (data rate) of the storage blocks (e.g., storage block1 through storage block4) included in the multi data rate memory device 300 may be sequentially stored consistent with conventionally understood FIFO operating methods. For example, access information associated with the first through fourth storage blocks may be sequentially stored in the FIFO 113_1, such that resulting data may then be sequentially transceived with the memory controller 100. In this case, the order in which the access information is input to, and output from the FIFO 113_1 may be consistent with respective operating speeds for the storage blocks. In other words, the slowest operating speed, then the next less slowest operating speed, etc. to the fastest operating speed may be sequentially loaded into the FIFO 113_1.

In one embodiment, the FIFO 113_1 may be implemented with a memory, or the FIFO 113_1 may be implemented with a plurality of registers.

Referring to FIGS. 1, 2 and 6, the processor 140 may be used to control the input/output of access information associated with the first through fourth storage blocks in/from the FIFO 113_1 in response to a corresponding host command CMD. Under these assumptions, when respective, subsequent commands associated with data processing operations (e.g., read/write operations) for the first through fourth storage blocks are received from the host, the processor 140 may sequentially store access information about the first through fourth storage blocks in the FIFO 113_1, based on respective priorities of the operations of the first through fourth storage blocks which are received along with the commands CMD. Accordingly, as illustrated in FIG. 6, an operation by the first storage block storage will have a highest priority, and an operation by the fourth storage block will have the lowest priority.

For example, when access information about the first storage block is received, the processor 140 may store the access information about the first storage block at an address indicated by a write pointer of the FIFO 113_1. Then the address indicated by the write pointer may be incremented. In this manner, the order in which the memory controller 100 transceives data with the plurality of storage blocks may be controlled by the processor 140. Of course, the sequential approach described in relation to FIG. 6 is only one example of a control approach to the identification the storage blocks. However, assuming the foregoing, the sub controller 110 may sequentially provide the control signal CTRL to the memory physical layer 120 based on the access information stored in the FIFO 113_1.

From the foregoing, it will be clear to one skilled in the art that access information in a variety of forms and definitions may be used to control a memory physical layer in relation to a plurality of storage blocks.

Thus, recognizing that a memory controller may transceive data with a plurality of storage blocks having different operating speeds according to an order defined by access information stored (e.g.,) in a FIFO, the different operating speeds of different storage blocks may be accommodated in a multi data rate memory device. Further, when a new storage block is connected to the memory controller, since it is possible to connect storage blocks to a channel, only access information related to new storage block must be stored (or updated) in the memory controller (e.g., a delay lookup table or scheduler 113 associated with a sub controller).

Although FIG. 6 illustrates an embodiment wherein the scheduler 113 is implemented as a FIFO 113_1, the scheduler 113 may alternately be implemented as a linked list. When the scheduler 113 is implemented as a linked list, an output order for the first through fourth storage blocks may be stored based on a priority order of operations associated with the first through fourth storage blocks.

Figure 7:
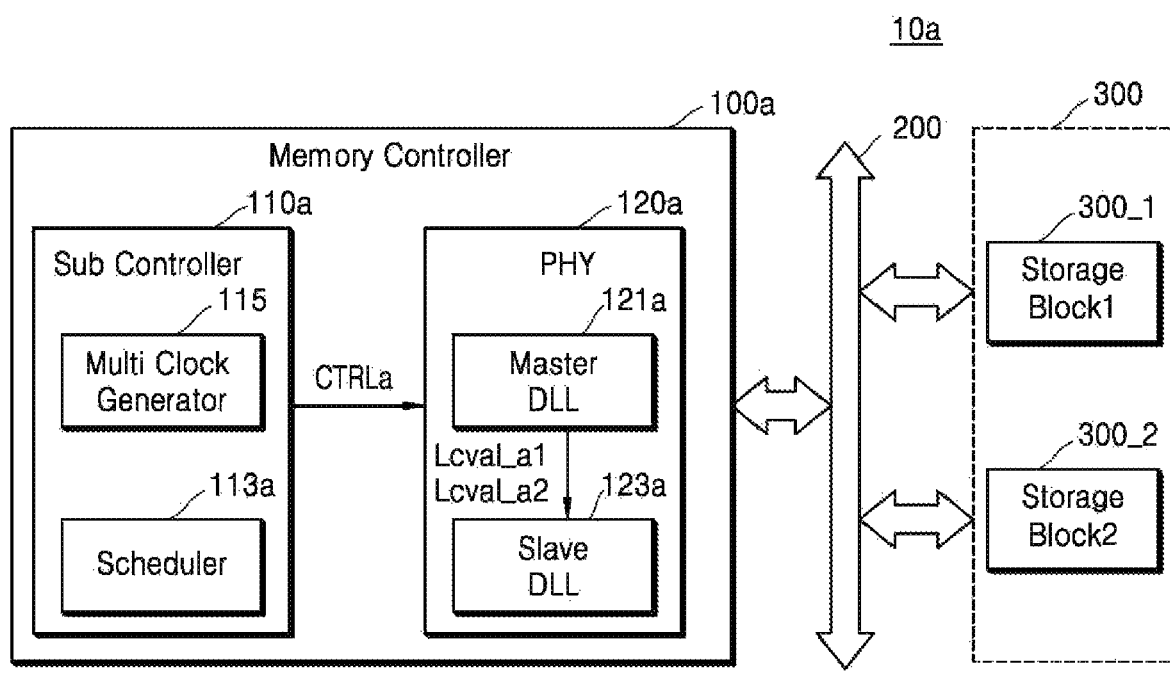
FIG. 7 is a block diagram illustrating another storage device according to embodiments of the inventive concept.
Figure 8A:
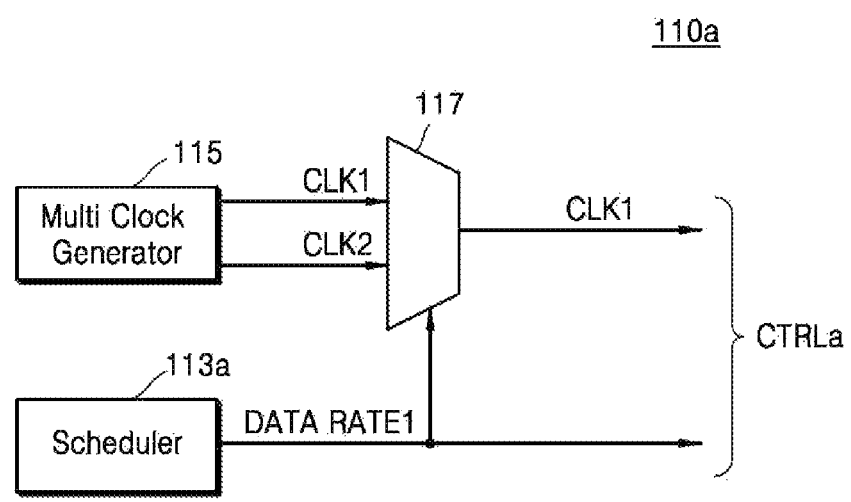
FIGS. 8A and 8B are respective circuit diagrams illustrating possible approaches to the operation of the sub controller of FIG. 7.
Figure 8B:
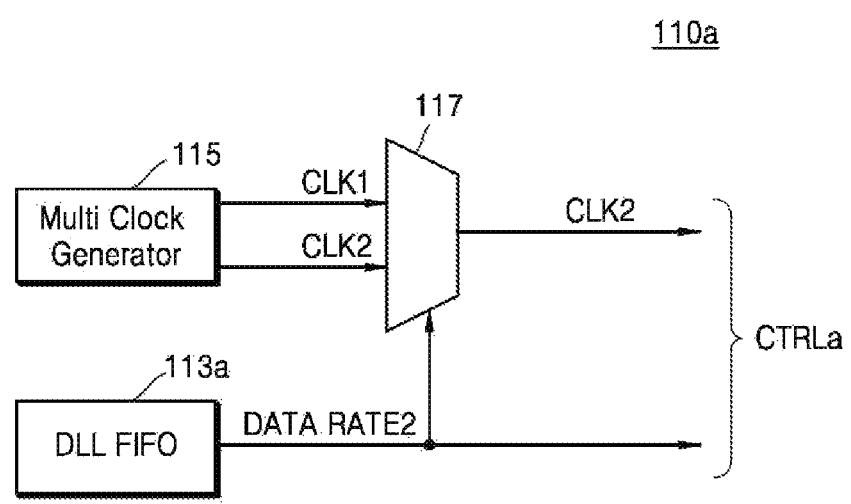

FIG. 7 is a block diagram illustrating a storage device 10a according to an certain embodiments of the inventive concept. Like reference numbers used in FIG. 3 are used to indicate like elements in FIG. 7. FIGS. 8A and 8B are respective circuit diagrams illustrating examples of sub controller 110a shown in FIG. 7.

Referring to FIG. 7, the storage device 10a includes the memory controller 100a, the channel 200, and the multi data rate memory device 300. The memory controller 100a includes a sub controller 110a and a memory physical layer 120a.

The sub controller 110a may include a scheduler 113a and the multi clock generator 115. The scheduler 113a may store information about the operating speeds of the memory controller 100a and the plurality of storage blocks 300_1 and 300_2.

The scheduler 113a may be a FIFO or a linked list, and access information about the operating speed of the first storage block 300_1, as well as access information about the operating speed of second storage block 300_2 may be sequentially stored in the FIFO or linked list. Accordingly, the sub controller 110a may sequentially provide a control signal CTRL to the memory physical layer 120a based on an order defined by access information stored in the scheduler 113a.

The multi clock generator 115 may be used to generate multiple clock signals having different frequencies. The clock signals generated by the multi clock generator 115 may include a first clock signal and a second clock signal having frequencies corresponding to the operating speeds of the first storage block 300_1 and the second storage block 300_2, respectively. Possible configurations for the multi clock generator 115 will be described hereafter with reference to FIGS. 9 and 10.

The control signal CTRLa may include information to control the memory physical layer 120a. For example, the control signal CTRLa may include access information defining the operating speed of the first storage block 300_1 and the second storage block 300_2, and well as information characterizing the clock signals generated by the multi clock generator 115.

Referring to FIGS. 8A and 8B, in one embodiment, the sub controller 110a may include a selector 117 (e.g., a multiplexer (MUX)), and the selector 117 may be used to select and output respective clock signal(s) corresponding to access information about the operating speed(s) of the storage blocks 300, as generated by the scheduler 113a among the clock signals having different frequencies generated by the multi clock generator 115.

For example, as illustrated in FIG. 8A, when access information about the operating speed of the first storage block 300_1 (DATA RATE1) is output from the scheduler 113a, the selector 117 may select and output a first clock signal CLK1 having a frequency corresponding to the operating speed of the first storage block 300_1 among the plurality of clock signals generated by the multi clock generator 115. That is, the control signal CTRLa may include the access information about the operating speed of the first storage block 300_1 (DATA RATE1) and the first clock signal CLK1.

In contrast, as illustrated in FIG. 8B, when access information about the operating speed of the second storage block 300_2 (DATA RATE2) is output from the scheduler 113a, the selector 117 may select and output a second clock signal CLK2 having a frequency corresponding to the operating speed of the second storage block 300_2 among the plurality of clock signals generated by the multi clock generator 115. That is, the control signal CTRLa may include the information about the operating speed of the second storage block 300_2 (DATA RATE1) and the first clock signal CLK2.

The configuration and operation of the sub controller 110a are not limited to those illustrated in FIGS. 8A and 8B, and the sub controller 110a need not necessarily include the selector 117. In another embodiment, the control signal CTRLa may include the plurality of clock signals generated by the multi clock generator 115, and may be transmitted to the memory physical layer 120a including the selector 117. The selector 117 included in the memory physical layer 120a may sequentially select and output the clock signal corresponding to information about the operating speeds of the plurality of storage blocks 300_1 and 300_2 sequentially output from the scheduler 113a.

Referring again to FIG. 7, the memory physical layer 120a may include a master DLL circuit 121a and a slave DLL circuit 123a. Compared with the memory physical layer 120 in FIG. 3, the memory physical layer 120a may receive clock signals of various frequencies from the sub controller 110a while the memory physical layer 120 receives identical clock signals.

The master DLL circuit 121a may sequentially output a number of delay cells corresponding to sequentially received clock signals (e.g., the first clock signal CLK1 and the second clock signal CKL2) as a first lock value and second lock value LCval_a1 and LCval_a2, respectively. The first lock value LCval_a1 may denote the number of delay cells that detect phase difference between the first clock signal CLK1 and a clock delayed by the first clock signal CLK1 and make the phase difference about 0. The second lock value LCval_a2 may denote the number of delay cells that detect phase difference between the second clock signal CLK2 and a clock delayed by the second clock signal CLK2 and make the phase difference about 0. Since the frequencies of the first clock signal CLK1 and the second clock signal CKL2 are different from each other, the fixed values LCval_a1 and LCval_a2 may also be different from each other.

The slave DLL circuit 123 may sequentially receive the first lock value LCval_a1 and the second lock value LCval_a2, and sequentially output to the channel 200 a first data strobe signal and the second data strobe signal with operation frequencies corresponding to the first storage block 300_1 and the second storage block 300_2, respectively.

The memory controller 100a and the storage device 10a including the memory controller 100a according to an embodiment may include the sub controller 110a such that the memory controller 100a sequentially transceives data with the storage blocks 300_1 and 300_2 having different operating speeds using one memory physical layer 120a (e.g., by using a single master DLL circuit 121 and a single slave DLL circuit 123). In addition, since the plurality of storage blocks 300_1 and 300_2 are connected to one channel 200, when a new storage block is to be connected to the memory controller 100a, it may not be necessary to configure a new channel and a new memory physical layer, which makes it advantageous to manufacture a memory controller.

Figure 9:
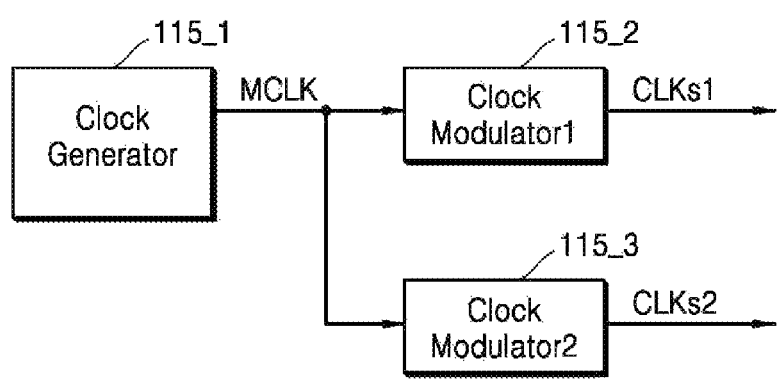
FIGS. 9 and 10 are respective block diagrams illustrating in various embodiments the multi clock generator of FIG. 7.

FIG. 9 is a block diagram further illustrating in one embodiment the multi clock generator 115 of FIG. 7.

Referring to FIGS. 7 and 9, the multi clock generator 115 includes a clock generator 115_1 and a plurality of clock modulators 115_2 and 115_3. The clock generator 115_1 may be used to generate a master clock signal MCLK.

The number of the plurality of clock modulators 115_2 and 115_3 may be determined based on the number of the plurality of storage blocks 300_1 and 300_2 connected to the memory controller 100a via the channel 200. In one embodiment, the multi clock generator 115 may include clock modulators 115_2 and 115_3 as many as the number of storage blocks having different operating speeds from each other.

Accordingly, the embodiment is not limited to including two clock modulators 115_2 and 115_3 as illustrated in FIG. 8, but may also include three or more clock modulators.

In one embodiment, the first clock modulator 115_2 may receive the master clock signal MCLK and modulate the master clock signal MCLK to a first slave clock signal CLKs1. The first slave clock signal CLKs1 may refer to the first clock signal CLK1 in FIG. 7, and the first slave clock signal CLKs1 may correspond to the operating speed of the first storage block 300_1. The first slave clock signal CLKs1 may be used to generate the first data strobe signal to transceive data with the first storage block 300_1.

The second clock modulator 115_3 may receive the master clock signal MCLK and modulate the master clock signal MCLK into a second slave clock signal CLKs2. The second slave clock signal CLKs2 may refer to the second clock signal CLK2 in FIG. 7 and the second slave clock signal CLKs2 may correspond to the operating speed of the second storage block 300_2. The second slave clock signal CLKs2 may be used to generate the second data strobe signal to transceive data with the second storage block 300_2. The first clock modulator 115_2 and the second clock modulator 115_3 may generate the first slave clock signal CLKs1 and the second slave clock signal CLKs2 by modulating the frequency of the master clock MCLK, respectively.

In another embodiment, the first slave clock signal CLKs1 and the master clock signal MCLK may have the same frequency without a frequency modulation operation performed by the first clock modulator 115_2 of the multi clock generator 115. Thus, the master clock signal MCLK may be used to generate the data strobe signal to transceive data with the first storage block 300_1. In other words, the clock generator 115_1 may generate the master clock signal MCLK based on the operating speed of the first storage block 300_1. For example, the clock generator 115_1 may generate the master clock signal MCLK based on the operating speed of the storage block operating at a higher speed among the plurality of storage blocks 300_1 and 300_2.

Figure 10:
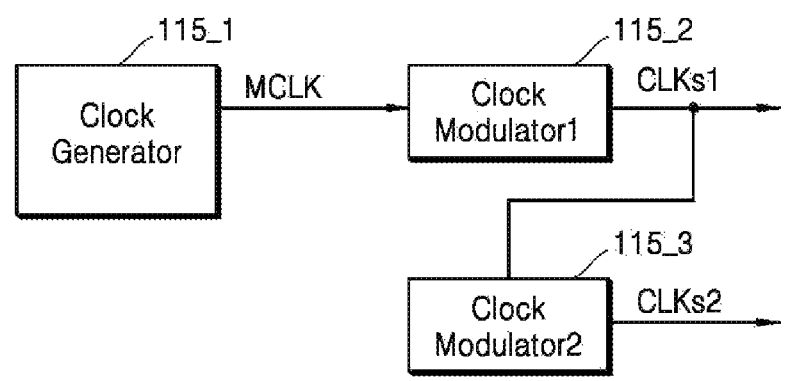

FIG. 10 is a block diagram further illustrating an embodiment of the multi clock generator 115 of FIG. 7. In FIGS. 9 and 10, like reference numbers denote like elements Referring to FIGS. 7 and 9, the multi clock generator 115a may include the clock generator 115_1 and the plurality of clock modulators 115_2 and 115_3. The clock generator 115_1 may generate the master clock signal MCLK.

In one embodiment, the first clock modulator 115_2 may receive the master clock signal MCLK and modulate the master clock signal MCLK to a first slave clock signal CLKs1. The first slave clock signal CLKs1 may correspond to the operating speed of the first storage block 300_1. The first slave clock signal CLKs1 may be used to generate the first data strobe signal to transceive data with the first storage block 300_1.

The second clock modulator 115_3 may receive the first slave clock signal CLKs1 from the first clock modulator 115_2 and may modulate the first slave clock signal CLKs2 to the second slave clock signal CLKs2. The second slave clock signal CLKs2 may correspond to the operating speed of the second storage block 300_2. The second slave clock signal CLKs2 may be used to generate the second data strobe signal to transceive data with the second storage block 300_2. The first clock modulator 115_2 may modulate the frequency of the master clock MCLK to generate the first slave clock signal CLKs1 and the second clock modulator 115_3 may modulate the frequency of the first slave clock signal CLKs1 to generate the second slave clock signal CLKs2.

In another embodiment, the multi clock generator 115a may further include a third clock modulator, and the third clock modulator may receive the second slave clock signal CLKs2 from the second clock modulator 115_3, modulate the frequency of the slave clock signal CLKs2 to generate a third slave clock signal. That is, the multi clock generator 115a need not separately include the first clock modulator 115_2, and may use the master clock signal MCLK to generate the data strobe signal for exchanging data with the first storage block 300_1. In other words, the clock generator 115_1 may generate the master clock signal MCLK based on the operating speed of the first storage block 300_1.

While the inventive concept has been particularly shown and described with reference to example embodiments thereof, it will be understood by one of ordinary skill in the art that various changes in form and details may be made therein without departing from the spirit and scope of the inventive concept as defined by the following claims. Accordingly, the true scope of protection of the inventive concept should be determined by the technical idea of the following claims.

What is claimed is:

1. A memory controller configured to control a first storage block operating at a first data rate and a second storage block operating at a second data rate different from the first data rate, the memory controller comprising:
   a memory interface configured to transceive data signal and a data strobe signal with the first storage block and the second storage block; and
   a sub controller including a delay lookup table storing access information including first strobe adjustment timing information defining a first data strobe signal provided to the first storage block, and second strobe adjustment timing information defining a second data strobe signal provided to the second storage block,
   wherein the first data strobe signal is provided to the first storage block and the second data strobe signal is provided to the second storage block in a sequential order defined by the access information, and
   a signal frequency of the first data strobe signal and a signal frequency of the second data strobe signal are different from each other.

2. The memory controller of claim 1, further comprising:
   a clock generator that generates a reference clock signal, wherein the first strobe adjustment timing information is a first time delay applied to the reference clock signal to define the first data strobe signal, and the second strobe adjustment timing information is a second time delay, different from the first time delay, applied to the reference clock signal to define the second data strobe signal.

3. The memory controller of claim 2, wherein a frequency of the reference clock signal is identical to a frequency of the first data strobe signal.

4. The memory controller of claim 1, wherein the memory interface comprises a single master delay locked loop (DLL) circuit and a single slave DLL circuit.

5. The memory controller of claim 1, wherein the sub controller comprises a First In First Out (FIFO), and the memory controller is configured to sequentially control operation of the first storage block and the second storage block in response to access information about the first operating speed and access information about the second operating speed stored in the FIFO.

6. The memory controller of claim 1, wherein the first storage block is a storage device and the second storage block is a processing in memory (PIM).

7. A storage device comprising:
a first storage block having a first operating speed;
a second storage block having second operating speed different from the first operating speed;
a memory controller configured to control operation of the first storage block and the second storage block; and
a channel configured to connect the memory controller with the first storage block, and the second storage block,
wherein the memory controller comprises:
a memory interface configured to transmit, via the channel, a first data strobe signal to the first storage block and a second data strobe signal to the second storage block; and
a sub controller configured to store access information about the first operating speed and the second operating speed,
wherein the access information is sequentially provided to the memory interface by the sub controller,
a signal frequency of the first data strobe signal and a signal frequency of the second data strobe signal are different from each other.

8. The storage device of claim 7, the sub controller comprises a First In First Out (FIFO) that stores the access information, and
the memory controller is further configured to sequentially control operation of the first storage block and then operation of the second storage block based on a sequence in which the access information is stored in the FIFO.

9. The storage device of claim 7, further comprising:
a processor configured to control an input of access information to, and an output of access information from the sub controller.

10. The storage device of claim 9, wherein the processor is configured to receive from a first command defining a first operation directed to the first storage block, a second command defining a second operation directed to the second storage block, and
the first operation has a higher operating priority than the second operation.

11. The storage device of claim 10, wherein the processor is configured to store the access information in the sub controller based on the operating priority of the first operation and the operating priority of the second operation.

12. The storage device of claim 7, wherein
the sub controller further comprises a delay lookup table configured to store a first delay time for the data strobe signal as applied to the first storage block and a second delay time for the data strobe signal as applied to the second storage block.

13. The storage device of claim 7, wherein the sub controller further comprises:
a multi clock generator configured to generate a plurality of clock signals having different frequencies.

14. The storage device of claim 7, further comprising:
a third storage block having the first operating speed.

15. A storage device comprising:
a first storage block having a first operating speed and a second storage block having a second operating speed different from the first operating speed;
a memory controller configured to control an operation of the first storage block and the second storage block; and
a channel configured to connect the memory controller with the first storage block and the second storage block,
wherein the memory controller comprises:
a sub controller configured to store access information associated with the first storage block and the second storage block based on respective operating priorities for the first storage block and the second storage block, and comprising a multi clock generator configured to generate a plurality of clock signals having different frequencies,
wherein the memory controller is configured to provide, via the channel, a first data strobe signal to the first storage block and a second data strobe signal to the second storage block in a sequential order defined by the access information, and
a signal frequency of the first data strobe signal and a signal frequency of the second data strobe signal are different from each other.

16. The storage device of claim 15, wherein an output sequence for the access information is determined according to the respective operating priorities for the first storage block and the second storage block.

17. The storage device of claim 15, wherein the multi clock generator comprises a reference clock generator and a plurality of clock modulators.

18. The storage device of claim 15, wherein the sub controller further comprises: a selector configured to receive the plurality of clock signals and select one clock signal from among the plurality of clock signals based on the access information output from the memory.

19. The storage device of claim 18, wherein the memory controller further comprises a single master delay locked loop (DLL) circuit and a single slave DLL circuit, and the master DLL circuit and the slave DLL circuit are configured to receive the selected clock signal and generate a signal transceived to at least one of the first storage block and the second storage block and corresponding to the selected clock signal.

* * * * *